United States Patent
Onodera et al.

(10) Patent No.: US 10,082,851 B2
(45) Date of Patent: Sep. 25, 2018

(54) COOLING APPARATUS AND INFORMATION PROCESSING APPARATUS

(71) Applicant: FUJITSU LIMITED, Kawasaki-shi, Kanagawa (JP)

(72) Inventors: Koichi Onodera, Kawasaki (JP); Naofumi Kosugi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/647,306

(22) Filed: Jul. 12, 2017

(65) Prior Publication Data

US 2018/0046233 A1 Feb. 15, 2018

(30) Foreign Application Priority Data

Aug. 15, 2016 (JP) .................................. 2016-159065

(51) Int. Cl.
*G06F 1/20* (2006.01)
*G06F 1/18* (2006.01)
*H05K 7/20* (2006.01)

(52) U.S. Cl.
CPC .............. *G06F 1/206* (2013.01); *G06F 1/181* (2013.01); *G06F 1/188* (2013.01); *G06F 1/20* (2013.01); *G06F 1/203* (2013.01); *H05K 7/20* (2013.01); *H05K 7/20009* (2013.01); *H05K 7/209* (2013.01); *H05K 7/20136* (2013.01); *H05K 7/20145* (2013.01); *H05K 7/20172* (2013.01); *H05K 7/20254* (2013.01); *H05K 7/20336* (2013.01); *H05K 7/20509* (2013.01); *H05K 7/20545* (2013.01); *H05K 7/20554* (2013.01); *H05K 7/20927* (2013.01); *G06F 2200/20* (2013.01); *G06F 2200/201* (2013.01)

(58) Field of Classification Search
None
See application file for complete search history.

(56) References Cited

U.S. PATENT DOCUMENTS

| | | | | |
|---|---|---|---|---|
| 5,704,416 | A * | 1/1998 | Larson | F28D 15/0241 165/104.21 |
| 2006/0096299 | A1 * | 5/2006 | Mamitsu | H01L 23/473 62/3.2 |
| 2010/0296229 | A1 * | 11/2010 | Meux | H02B 1/056 361/605 |
| 2010/0328893 | A1 * | 12/2010 | Higashidani | H05K 7/20927 361/702 |
| 2017/0034949 | A1 * | 2/2017 | Yokoi | H01L 23/473 |
| 2017/0330817 | A1 * | 11/2017 | Kawano | H01L 23/40 |

FOREIGN PATENT DOCUMENTS

| | | |
|---|---|---|
| JP | 1-132146 | 5/1989 |
| JP | 6-132686 | 5/1994 |
| JP | 2008-153464 | 7/2008 |

* cited by examiner

*Primary Examiner* — Dimary Lopez Cruz
*Assistant Examiner* — Zhengfu Feng
(74) *Attorney, Agent, or Firm* — Fujitsu Patent Center

(57) ABSTRACT

A cooling apparatus includes an assembly including an electronic device and a potting material that covers a side portion and an upper portion of the electronic device, the assembly having a conical upper portion, and a cooling plate including a conical hole, into which the upper portion of the assembly is fitted, and a flow path, through which a coolant flows.

10 Claims, 19 Drawing Sheets

COOLING APPARATUS AND INFORMATION PROCESSING APPARATUS

CROSS-REFERENCE TO RELATED APPLICATION

This application is based upon and claims the benefit of priority of the prior Japanese Patent Application No. 2016-159065, filed on Aug. 15, 2016, the entire contents of which are incorporated herein by reference.

FIELD

The embodiments discussed herein are related to a cooling apparatus and an information processing apparatus.

BACKGROUND

Electronic components such as, for example, a Central Processing Unit (CPU) used in a high-performance information processing apparatus, which is called a data center server or a supercomputer, generate a large amount of heat during the operation thereof. An allowable upper-limit temperature is set for these electronic components, and, when these electronic components exceed the allowable upper-limit temperature, a deterioration in the processing capability of the information processing apparatus, or a malfunction or failure of the information processing apparatus may be caused. Therefore, it is important to cool the electronic components such that the temperature of the electronic components does not exceed the allowable upper-limit temperature.

Cooling devices for cooling electronic components include an air cooling type cooling device and a water cooling type cooling device. Since large-scale data centers and supercomputers require a reduction in operation costs, the water cooling type cooling device, which may reduce the operation costs compared to the air cooling type cooling device, is often adopted.

The water cooling type cooling device includes a cooling plate, which is attached to a component that generates a large amount of heat (hereinafter referred to as a "heat generating component"), a heat dissipation unit, which is disposed at a place distant from the cooling plate, and a pump, which circulates cooling water between the cooling plate and the heat dissipation unit.

The cooling plate is formed of a metal having high thermal conductivity, and a flow path, through which the cooling water flows, is formed inside the cooling plate. In addition, the heat dissipation unit is provided with a heat dissipation device such as, for example, a radiator.

The heat generated from the heat generating component is transported to the heat dissipation unit by the cooling water passing through the cooling plate, and dissipated from the heat dissipation unit to the atmosphere. In addition, the cooling water, the temperature of which has been lowered as the heat dissipation unit dissipates the heat, is again sent to the cooling plate by the pump.

In addition, herein, water or other coolant, which is used to transport the heat from the cooling plate to the heat dissipation unit, is called cooling water.

In the related art, there has been proposed a technique of improving heat dissipation efficiency by forming an inclined surface on each of a heat generating component and a cooling member, which cools the heat generating component, so that heat is transferred from the heat generating component to the cooling member via the inclined surfaces.

In the information processing apparatus, heat is generated not only in a semiconductor component such as, for example, a CPU, but also in a power supply unit. In the related art, a cooling plate is attached to a semiconductor component such as, for example, the CPU, which generates a large amount of heat, and a power supply unit and other components, which generate a small amount of heat, are air-cooled using a relatively small fan.

However, with higher performance, the power consumption of servers or supercomputers is increasing, and the amount of heat generated by power supply units or the like is also increasing. Therefore, cooling using a water cooling method has been studied with respect to power supply units or the like as well.

Generally, a power supply unit is provided with relatively large electronic components such as, for example, a transformer, and these components generate a large amount of heat. However, in the case of an electronic component (heat generating component) such as, for example, a transformer, it is impossible to cool the entire electronic component simply by bringing a portion of the electronic component into contact with the cooling plate.

The followings are reference documents.
[Document 1] Japanese Patent Laid-Open Publication Nos. 01-132146,
[Document 2] Japanese Patent Laid-Open Publication 2008-153464, and
[Document 3] Japanese Patent Laid-Open Publication 06-132686.

SUMMARY

According to an aspect of the invention, a cooling apparatus includes an assembly including an electronic device and a potting material that covers a side portion and an upper portion of the electronic device, the assembly having a conical upper portion, and a cooling plate including a conical hole, into which the upper portion of the assembly is fitted, and a flow path, through which a coolant flows.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, prior to describing the exemplary embodiments, preliminary matters will be described to facilitate the understanding of the exemplary embodiments.

Figure 1:
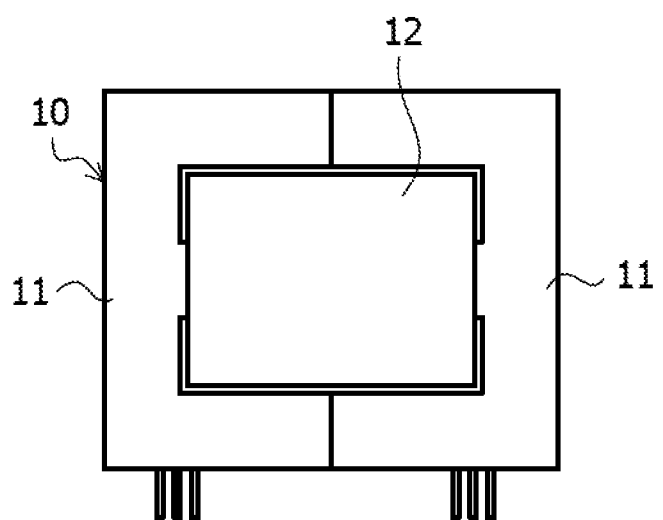
FIG. 1 is a front view illustrating an example of a transformer.

FIG. 1 is a front view (schematic view) illustrating an example of a transformer.

The transformer 10 illustrated in FIG. 1 is configured such that two E-shaped cores 11 formed of a magnetic substance are disposed to face each other with an insulating thin film (not illustrated) interposed therebetween, and a copper wire is wound around the center portion of the cores 11. In FIG. 1, reference numeral 12 designates a winding portion on which the copper wire is wound.

The external appearance of the transformer 10 is substantially a cubic shape. In the transformer 10, heat is generated not only in the copper wire, in which current flows, but also in the cores 11, through which magnetic lines pass.

Figure 2:
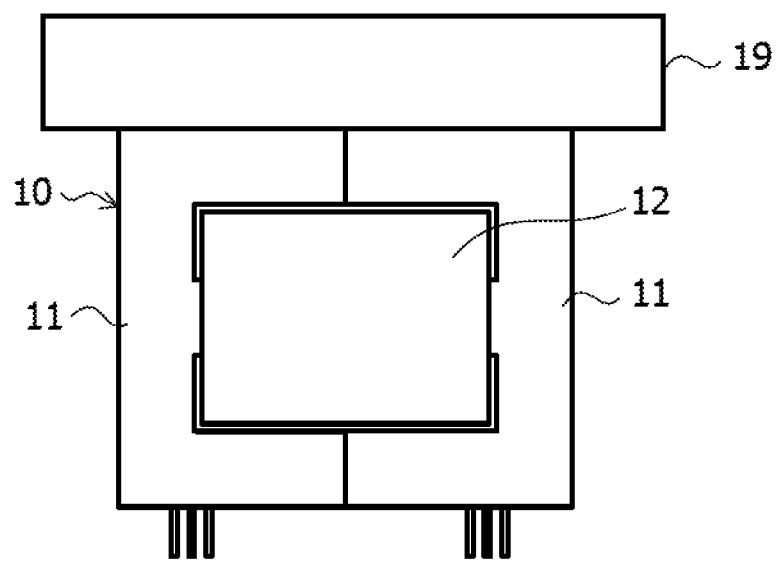
FIG. 2 is a schematic view illustrating an example of a cooling method of the transformer.

In order to cool the transformer 10, for example, as illustrated in FIG. 2, it may be considered to cool the entire transformer 10 via the cores 11 by attaching a cooling plate 19 on the transformer 10 and causing cooling water to flow through the cooling plate 19.

However, since the magnetic substance used in the cores 11 is not so high in thermal conductivity, although the vicinity of the cooling plate 19 may be cooled by the cooling method illustrated in FIG. 2, it is difficult to sufficiently cool a portion that is distant from the cooling plate 19.

Therefore, in the cooling method illustrated in FIG. 2, the temperature of the transformer 10 may exceed an allowable upper-limit temperature, and in order to avoid this, it may be necessary to limit the current flowing through the transformer 10. For example, even if the transformer may output up to 500 W as long as cooling is sufficient, the transformer may output only up to about 250 W so as not to exceed the allowable upper-limit temperature.

In the following embodiments, a cooling unit, which may sufficiently cool an entire component even if the component is a relatively large heat generating component, will be described.

First Embodiment

Figure 3:
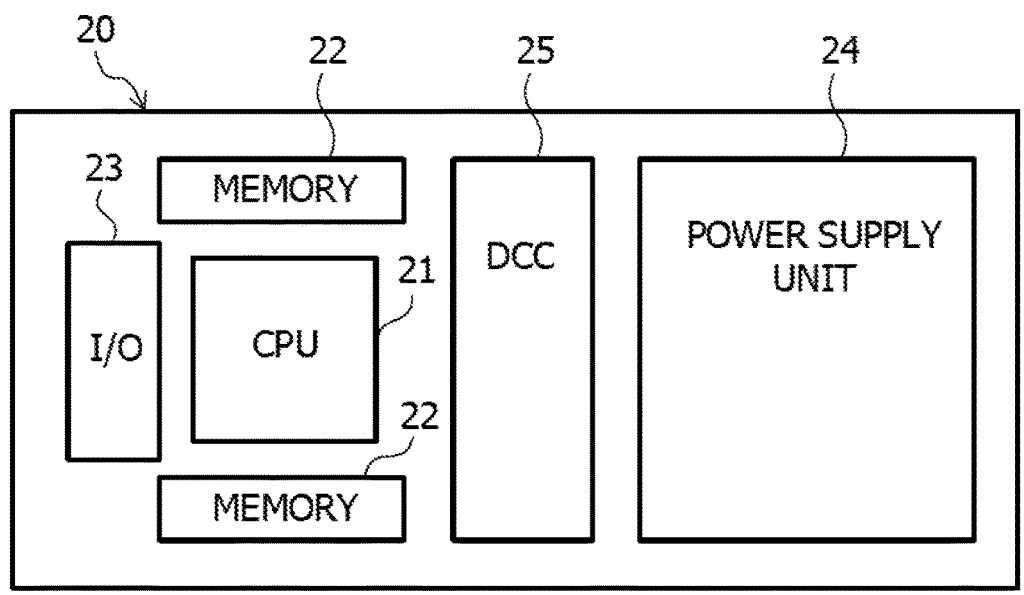
FIG. 3 is a block diagram illustrating an example of an information processing apparatus according to a first embodiment.
Figure 4:
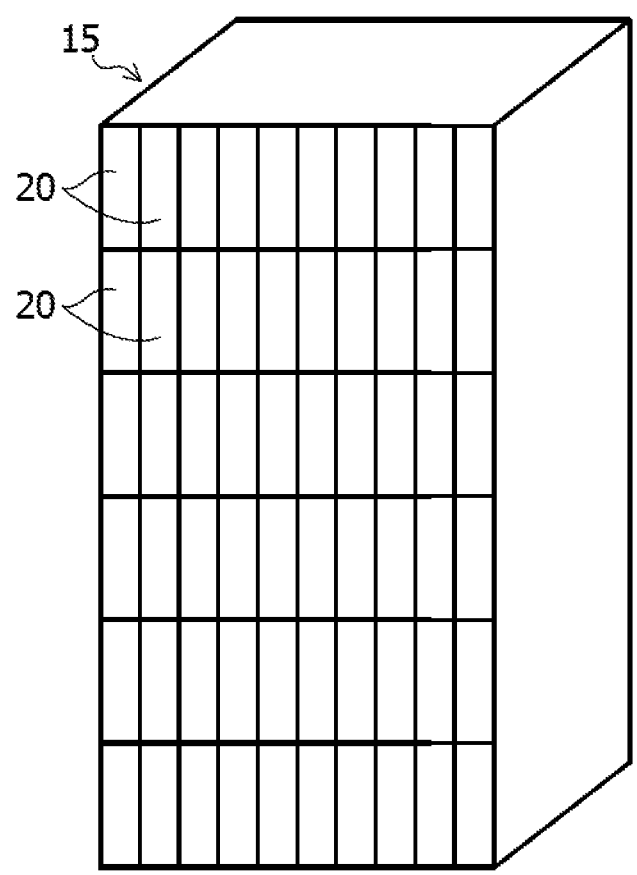
FIG. 4 is a perspective view illustrating a rack in which the information processing apparatus is accommodated.

FIG. 3 is a block diagram illustrating an example of an information processing apparatus according to a first embodiment, and FIG. 4 is a perspective view (schematic view) illustrating a rack in which the information processing apparatus is accommodated. In the present embodiment, a case where the information processing apparatus is a data center server will be described.

In the data center, multiple racks 15 are provided in an air-conditioned room. In each rack 15, as illustrated in FIG. 4, multiple servers (information processing apparatuses) 20 are accommodated. As illustrated in FIG. 3, each of these servers 20 includes a CPU 21, a memory 22, an input/output unit (I/O) 23, a power supply unit 24, and a direct current converter (DC converter) 25.

Figure 5:
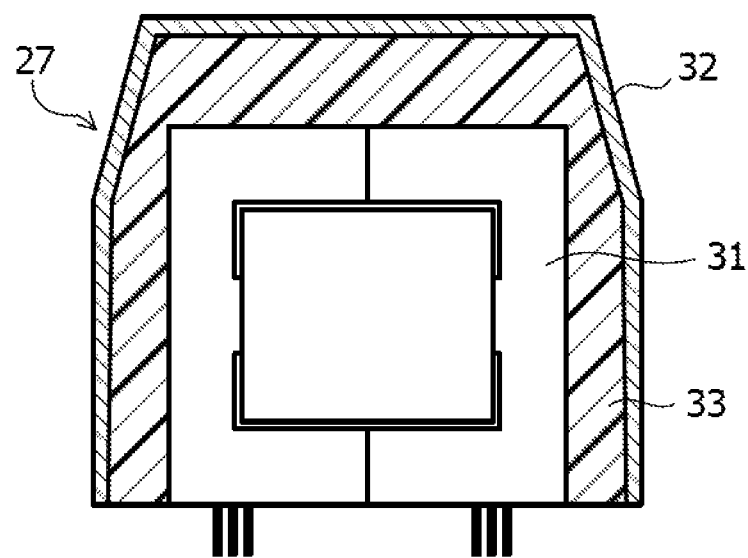
FIG. 5 is a cross-sectional view illustrating a transformer unit disposed in a power supply unit.

FIG. 5 illustrates a transformer unit 27 disposed in the power supply unit 24. The transformer unit 27 is an example of an assembly.

The transformer unit 27 includes a transformer 31, a component case 32 covering the transformer 31, and a potting material 33 provided between the transformer 31 and the component case 32 to thermally connect the transformer 31 and the component case 32 to each other.

In the same manner as the transformer 10 illustrated in FIG. 1, the transformer 31 includes two E-shaped cores and a copper wire wound around the center portions of the cores. The transformer 31 is an example of an electronic component and a winding component.

The component case 32 has an upturned cup shape, and is formed of a material having high thermal conductivity such as, for example, copper (including a copper alloy) or aluminum (including an aluminum alloy). In the present embodiment, a portion of the component case 32, which surrounds the lateral side of the transformer 31, has a cylindrical shape, and the upper portion of the component case 32 has a truncated conical shape. The thickness of the component case 32 is, for example, 2 mm.

The potting material 33 only needs to be insulative and have somewhat high thermal conductivity, and a general epoxy-based or silicon-based potting resin may be used for the potting material 33. However, when the component case 32 is filled with a potting resin, a defoaming processing may be performed in order to suppress the generation of air bubbles that cause a deterioration in thermal conductivity.

Figure 6:
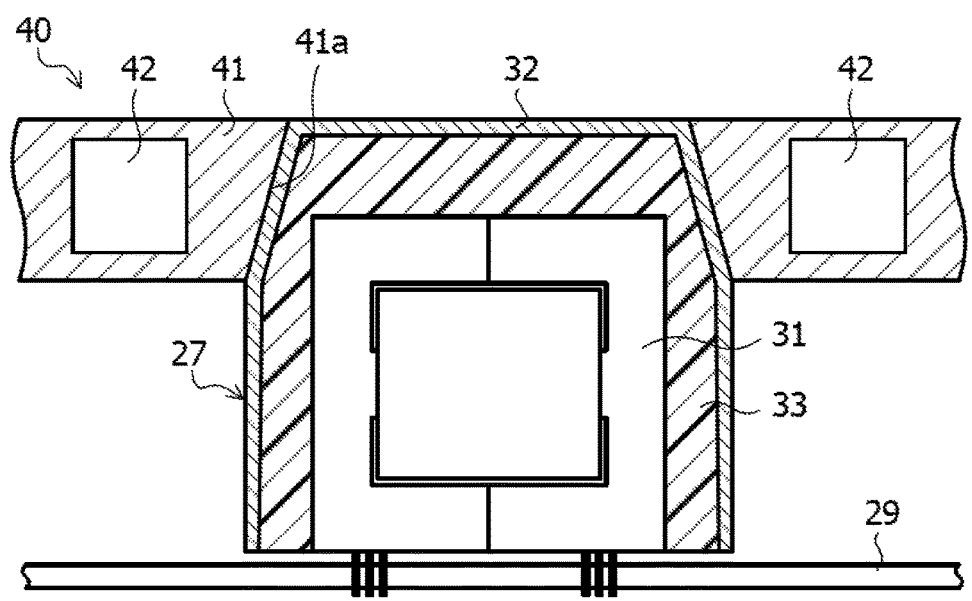
FIG. 6 is a cross-sectional view illustrating a cooling unit for the information processing apparatus according to the first embodiment.

FIG. 6 is a cross-sectional view (schematic view) illustrating a cooling unit 40 for the information processing apparatus according to the present embodiment.

The cooling unit 40 includes the above-described transformer unit 27 and a cooling plate 41 attached to the upper portion of the transformer unit 27. The transformer unit 27 is mounted on a circuit board 29 as illustrated in FIG. 6. In addition to the transformer unit 27, for example, the CPU 21, the memory 22, the input/output unit 23, and the DC converter 25, which are illustrated in FIG. 3, are mounted on the circuit board 29.

The cooling plate 41 is provided with a truncated conical hole 41a, which corresponds to the upper portion of the component case 32. When the upper portion of the component case 32 is fitted into the hole 41a in the cooling plate 41, the component case 32 and the cooling plate 41 are thermally connected to each other.

In the present embodiment, both the upper portion of the component case 32 and the hole 41a have a conical shape. Therefore, for example, even if the size of the component case 32 varies, it is possible to prevent a gap from being formed between the upper surface of the component case 32 and the surface of the hole 41a by adjusting the vertical position of the cooling plate 41. Therefore, the transformer unit 27 (the component case 32) and the cooling plate 41 are always in surface contact with each other, whereby thermal resistance therebetween is reduced.

In addition, a thermal conductive material such as, for example, thermally conductive grease may be disposed between the component case 32 and the cooling plate 41 so as to further reduce the thermal resistance between the component case 32 and the cooling plate 41.

Figure 7:
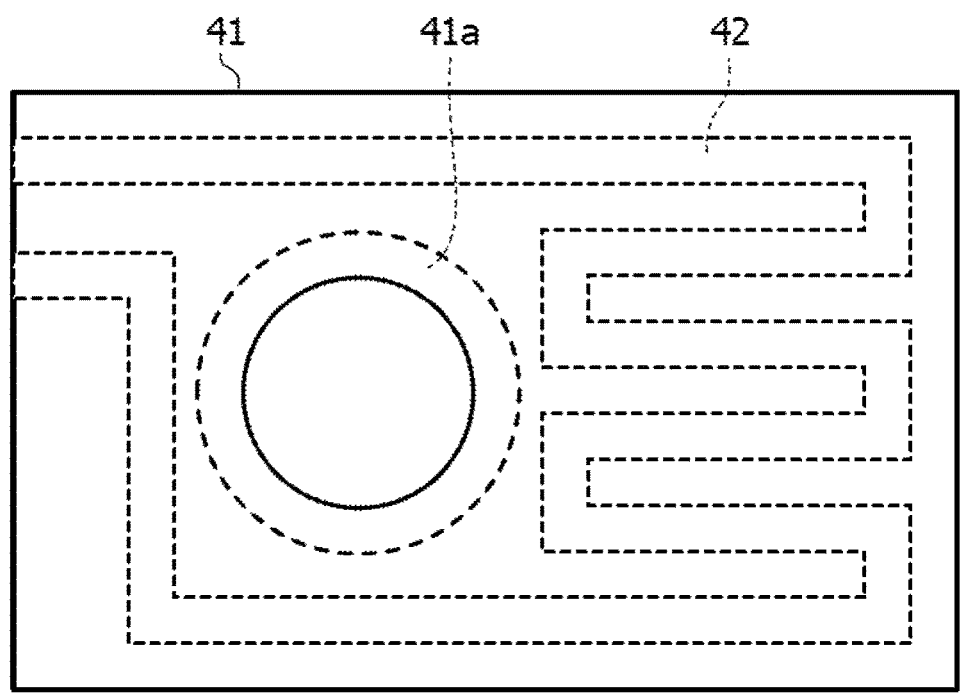
FIG. 7 is a top plan view of a cooling plate.

FIG. 7 is a top plan view of the cooling plate 41. In the cooling plate 41, a flow path 42, through which cooling water flows, is formed. As illustrated in FIG. 7, the flow path 42 is disposed in a zigzag form so as to avoid the hole 41a, into which the transformer unit 27 (the upper portion of the component case 32) is fitted.

Figure 8:
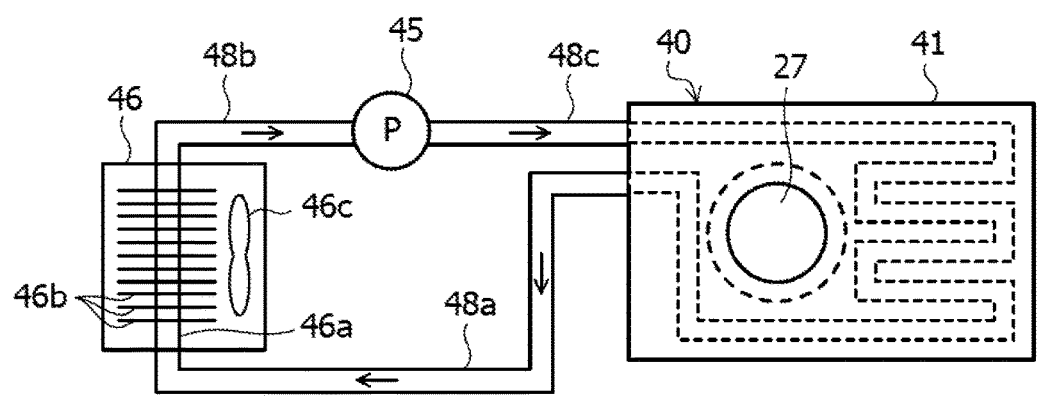
FIG. 8 is a schematic view illustrating a cooling method of the information processing apparatus using the cooling unit of the first embodiment.

FIG. 8 is a schematic view illustrating a cooling method of the information processing apparatus using the cooling unit 40 of the present embodiment. In FIG. 8, the arrows indicate the direction of movement of the cooling water.

As illustrated in FIG. 8, a cooling water outlet of the cooling plate 41 is connected to a cooling water inlet of a heat dissipation unit 46 via a pipe 48a. In addition, a cooling water outlet of the heat dissipation unit 46 is connected to a water suction port of a pump 45 via a pipe 48b, and a delivery port of the pump 45 is connected to a cooling water inlet of the cooling plate 41 via a pipe 48c.

In the present embodiment, a radiator is used as the heat dissipation unit 46, which includes a flow path 46a through which cooling water passes, multiple fins 46b disposed along the flow path 46a, and a fan (blower) 46c, which causes air to flow between the fins 46b.

When the information processing apparatus is operated, heat generated in the transformer 31 (see FIG. 6) is transferred to the cooling plate 41 via the potting material 33 and the component case 32. Then, the heat is transported to the heat dissipation unit 46 via the cooling water flowing through the cooling plate 41, and is dissipated from the heat dissipation unit 46 to the atmosphere.

In the present embodiment, the side portion and the upper portion of the transformer 31 are covered with the potting material 33 and the component case 32, and the upper portion of the component case 32 is fitted into the conical hole 41a formed in the cooling plate 41. Therefore, the heat generated in the transformer 31 is transferred to the cooling plate 41 via the potting material 33 and the component case 32, and is transported from the cooling plate 41 to the heat dissipation unit 46 via the cooling water, thereby being dissipated from the heat dissipation unit 46 to the atmosphere.

For example, in the cooling method illustrated in FIG. 2, heat is transferred to the cooling plate 19 only from the upper portion of the transformer 11. On the other hand, in the present embodiment, heat is transferred not only from the upper portion of the transformer 31, but also from the side portion of the transformer 31 to the cooling plate 41 via the potting material 33 and the component case 32.

Therefore, with the cooling unit 40 according to the present embodiment, the entire transformer 31 may be cooled, and the temperature of the transformer 31 may be avoided from exceeding an allowable upper-limit temperature. Thereby, it is unnecessary to excessively limit the current flowing through the transformer 31, so that the transformer 31 is able to exert the original performance thereof.

In addition, in the cooling unit 40 according to the present embodiment, the cooling plate 41 is provided with the truncated conical hole 41a, and the upper portion of the component case 32 of the transformer unit 27 is fitted into the hole 41a. Therefore, as compared with the cooling method illustrated in FIG. 2, the distance from the circuit board 29 to the upper surface of the cooling plate 41 is reduced. As a result, the information processing apparatus using the cooling unit 40 according to the present embodiment has a lower height than the information processing apparatus, which adopts the cooling method illustrated in FIG. 2, so that the size of the information processing apparatus is capable of being reduced.

Second Embodiment

Figure 9:
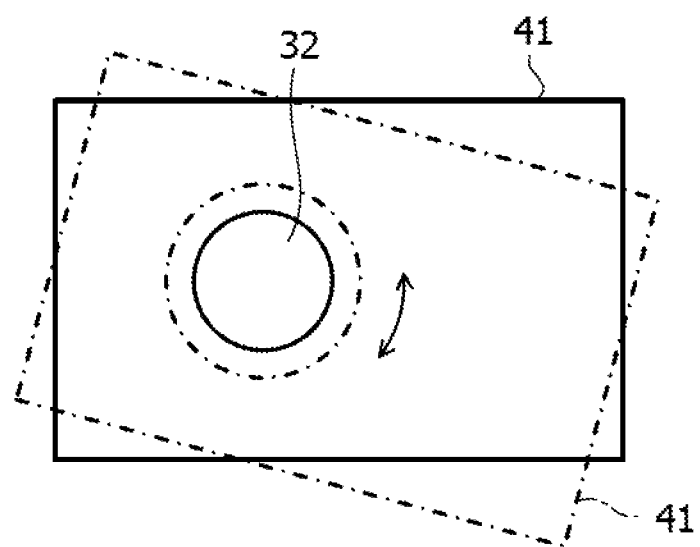
FIG. 9 is a schematic view illustrating positional deviation of a cooling plate in the rotation direction.

In the first embodiment, the upper portion of the component case 32, which covers the transformer 31, has a truncated conical shape. Therefore, as illustrated in FIG. 9, it may be considered that the cooling plate 41 may rotate about the center of the component case 32, and thus, positional deviation may be caused in the rotation direction.

In order to avoid this positional deviation in the rotational direction, for example, it may be considered that a guide pin is installed on the power supply unit side and a hole, into which the guide pin is fitted, is formed on the cooling plate side. However, in that case, the size of the power supply unit is increased in order to secure a space to install the guide pin, and as a result, the size reduction of the information processing apparatus is hindered.

In the second embodiment, a cooling unit, which may suppress the positional deviation of a cooling plate in the rotational direction without increasing the size of a power supply unit, will be described.

Figure 10A:
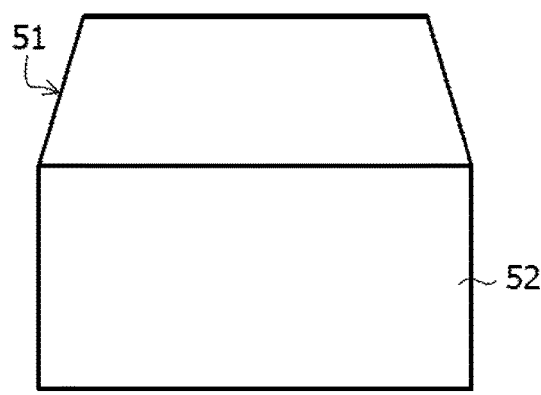
FIG. 10A is a side view of a transformer unit used in a cooling unit of a second embodiment.
Figure 10B:
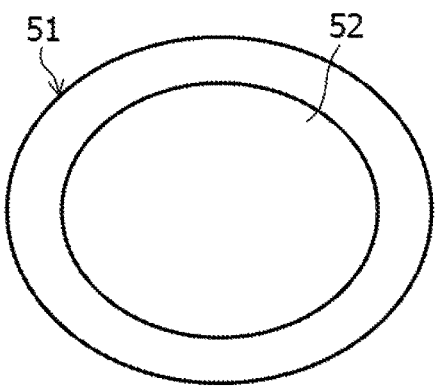
FIG. 10B is a top plan view of the transformer unit.

FIG. 10A is a side view of a transformer unit 51 used in a cooling unit 50 of a second embodiment, and FIG. 10B is a top plan view of the transformer unit 51. In addition, FIG. 11 is a top plan view illustrating the cooling unit 50 according to the second embodiment.

In the same manner as the transformer unit 27 illustrated in FIG. 5, the transformer unit 51 includes a transformer (not illustrated in FIGS. 10A and 10B), a component case 52, and a potting material (not illustrated in FIGS. 10A and 10B).

As illustrated in FIGS. 10A and 10B, the portion of the component case 52, which surrounds the side portion of the transformer, is formed in a cylindrical shape, and the upper portion of the component case 52 is formed in a conical shape. However, in both the cylindrical portion and the conical portion, the cross section parallel to the horizontal plane has an elliptical shape.

Figure 11:
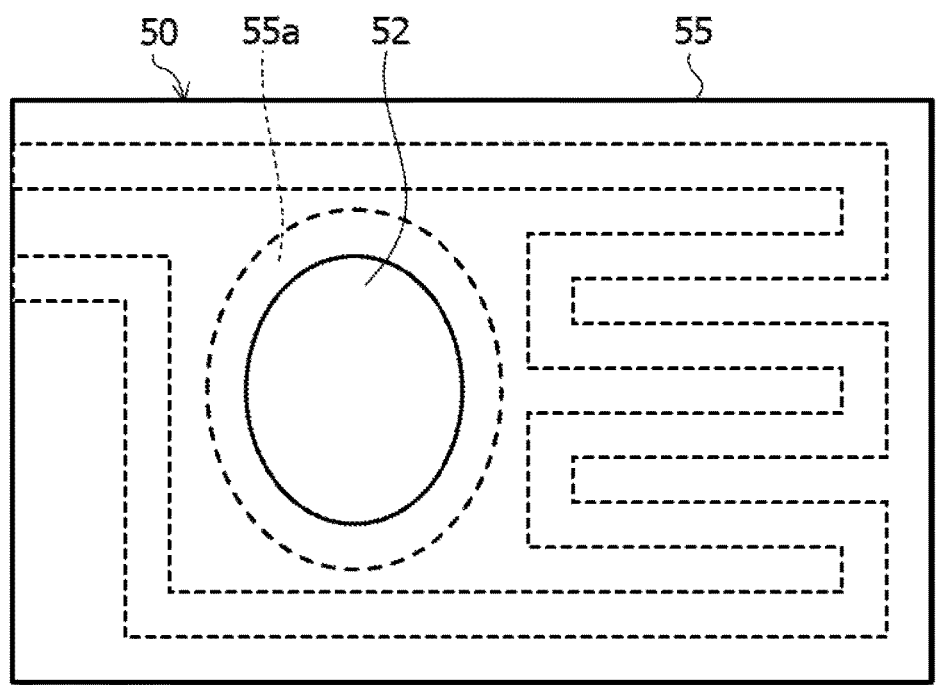
FIG. 11 is a top plan view illustrating the cooling unit according to the second embodiment.

As illustrated in FIG. 11, a cooling plate 55 is provided with a conical hole 55a, which corresponds to the shape of the upper portion of the component case 52. When the upper portion of the component case 52 is fitted into the hole 55a in the cooling plate 55, the component case 52 and the cooling plate 55 are thermally connected to each other.

As illustrated in FIGS. 10A and 10B, the cooling unit 50 according to the present embodiment has an elliptical shape when the component case 52 is viewed from above. In addition, the upper portion of the component case 52 is fitted into the elliptical conical hole 55a in the cooling plate 55. Therefore, the positional deviation of the cooling plate 55 in the rotation direction may be avoided without using the guide pin and the like, that is, without increasing the size of the power supply unit.

In addition, in the present embodiment, in the same manner as the first embodiment, heat generated in the transformer is transferred to the cooling plate 55 via the potting material and the component case 52, and is transported from the cooling plate 55 to the heat dissipation unit (see FIG. 8) via the cooling water. Therefore, the temperature of the transformer may be avoided from exceeding the allowable upper-limit temperature, and the size reduction of the information processing apparatus may be enabled.

(Modification 1)

Figure 12A:
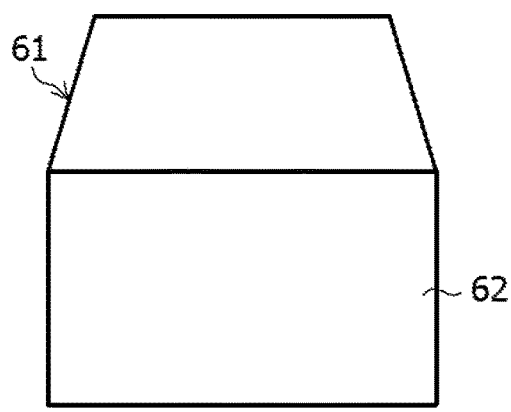
FIG. 12A is a side view of a transformer unit used in a cooling unit of modification 1 of the second embodiment.
Figure 12B:
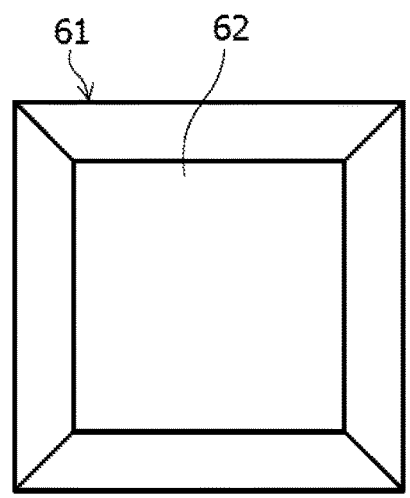
FIG. 12B is a top view of the transformer unit.

FIG. 12A is a side view of a transformer unit 61 used in a cooling unit 60 of modification 1 of the second embodiment, and FIG. 12B is a top plan view of the transformer unit 61. In addition, FIG. 13 is a top plan view illustrating the cooling unit 60 according to modification 1.

In the same manner as the transformer unit 27 illustrated in FIG. 5, the transformer unit 61 includes a transformer (not illustrated in FIGS. 12A and 12B), a component case 62, and a potting material (not illustrated in FIGS. 12A and 12B).

As illustrated in FIGS. 12A and 12B, the portion of the component case 62, which surrounds the side portion of the transformer, is formed in a cylindrical shape, and the upper portion of the component case 62 is formed in a conical shape. However, in both the cylindrical portion and the conical portion, the cross section parallel to the horizontal plane has a rectangular shape.

Figure 13:
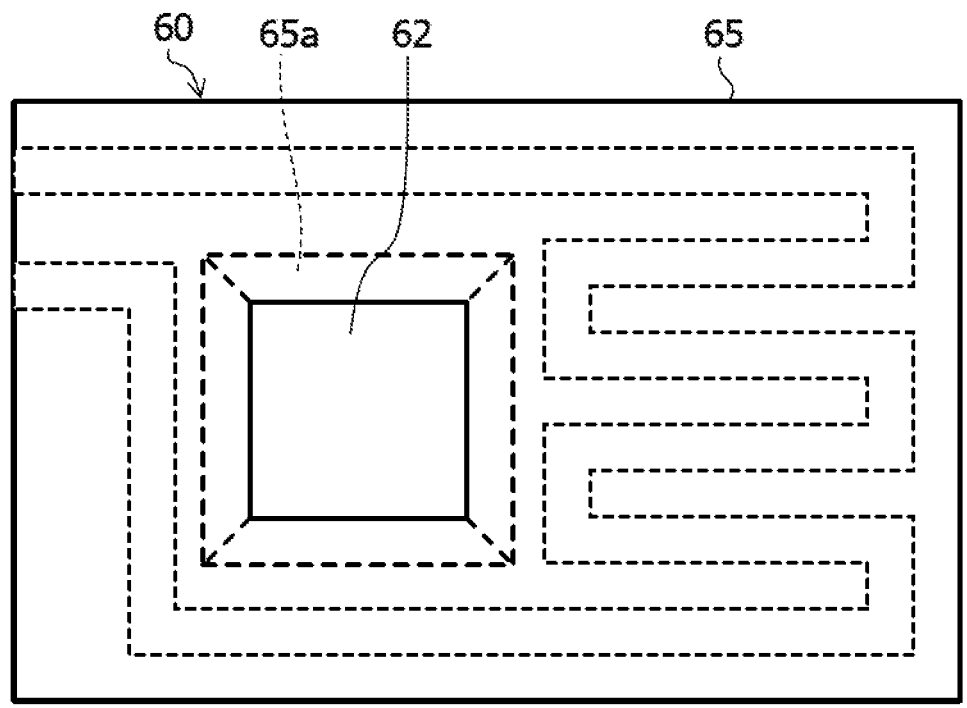
FIG. 13 is a top view illustrating the cooling unit according to modification 1 of the second embodiment.

As illustrated in FIG. 13, a cooling plate 65 is provided with a square conical hole 65a, which corresponds to the shape of the upper portion of the component case 62. When the upper portion of the component case 62 is fitted into the hole 65a in the cooling plate 65, the component case 62 and the cooling plate 65 are thermally connected to each other.

In modification 1 illustrated in FIGS. 12A and 12B and FIG. 13, in the same manner as the cooling unit 50 illustrated in FIG. 11, the positional deviation of the cooling plate 65 in the rotation direction may be avoided without using the guide pin and the like, that is, increasing the size of the power supply unit.

(Modification 2)

Figure 14A:
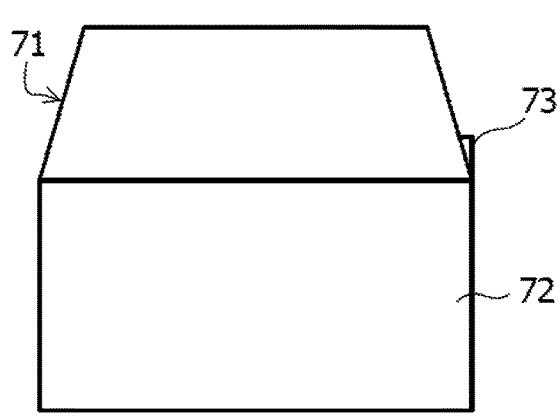
FIG. 14A is a side view of a transformer unit used in a cooling unit of modification 2 of the second embodiment.
Figure 14B:
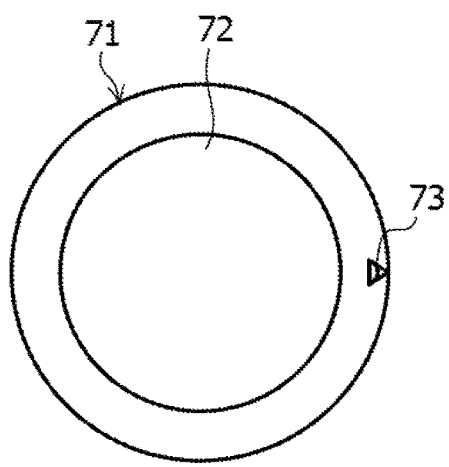
FIG. 14B is a top plan view of the transformer unit.

FIG. 14A is a side view of a transformer unit 71 used in a cooling unit 70 of modification 2 of the second embodiment, and FIG. 14B is a top plan view of the transformer unit 71. In addition, FIG. 15 is a top plan view illustrating the cooling unit 70 according to modification 2.

In the same manner as the transformer unit 27 illustrated in FIG. 5, the transformer unit 71 includes a transformer (not illustrated in FIGS. 12A and 12B), a component case 72, and a potting material (not illustrated in FIGS. 12A and 12B).

As illustrated in FIGS. 14A and 14B, the portion of the component case 72, which surrounds the side portion of the transformer, is formed in a cylindrical shape, and the upper portion of the component case 72 is formed in a truncated conical shape. However, the component case 72 is provided with a convex portion 73.

Figure 15:
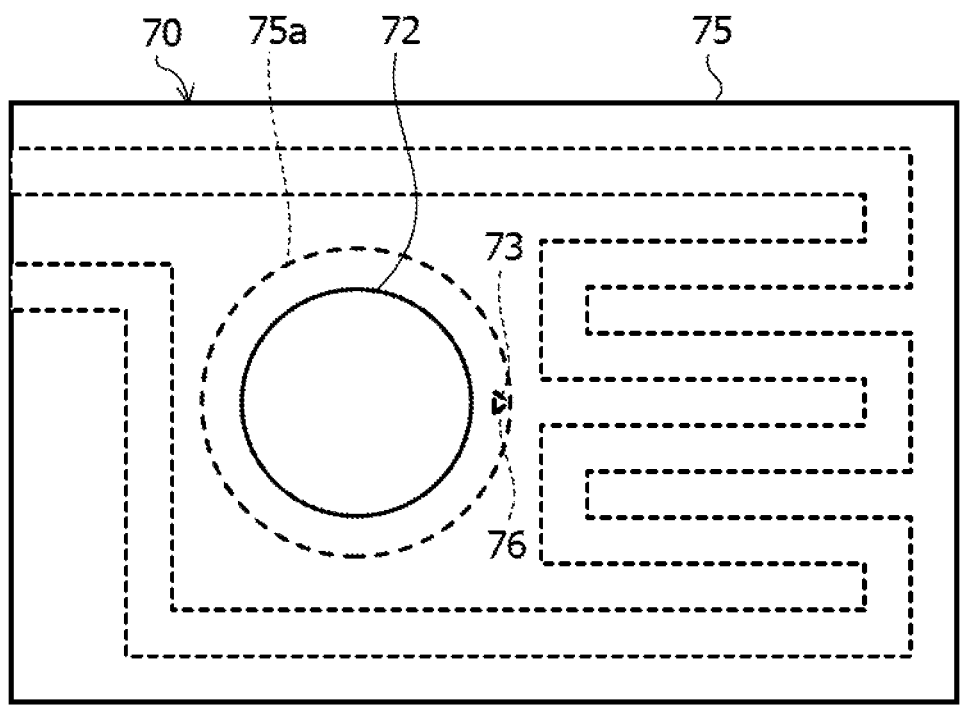
FIG. 15 is a top plan view illustrating the cooling unit according to modification 2 of the second embodiment.

As illustrated in FIG. 15, the cooling plate 75 is provided with a truncated conical hole 75a, which corresponds to the shape of the upper portion of the component case 72. In addition, the cooling plate 75 is provided with a concave portion 76, which has a size and a shape corresponding to those of the convex portion 73 of the component case 72.

When the upper portion of the component case 72 is fitted into the hole 75a in the cooling plate 75 and the convex portion 73 of the component case 72 and the concave portion 76 of the cooling plate 75 are fitted to each other, the component case 72 and the cooling plate 75 are thermally connected to each other.

In modification 2 illustrated in FIGS. 14A and 14B and FIG. 15, in the same manner as the cooling unit 50 illustrated in FIG. 11, the positional deviation of the cooling plate 75 in the rotation direction may be avoided without using the guide pin and the like, that is, without increasing the size of the power supply unit.

In addition, in the present embodiment, although the convex portion 73 is provided on the transformer unit 71 side and the concave portion 76 is provided on the cooling plate 75 side, the concave portion may be provided on the transformer unit 71 side and the convex portion may be provided on the cooling plate 75 side.

Third Embodiment

Figure 16:
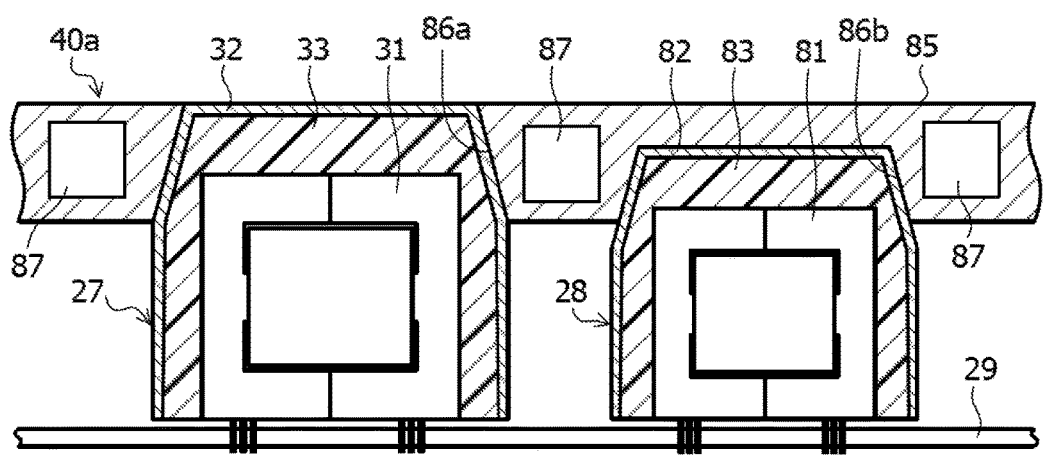
FIG. 16 is a cross-sectional view illustrating a cooling unit according to a third embodiment.

FIG. 16 is a cross-sectional view (schematic view) illustrating a cooling unit according to a third embodiment.

Since a cooling unit 40a according to the present embodiment is basically the same as that of the first embodiment except that two transformer units 27 and 28 are cooled by one cooling plate 85, a repeated description will be omitted herein.

The transformer unit 27 includes the transformer 31, the component case 32, and the potting material 33 provided therebetween. In the same manner as the transformer unit 27, the transformer unit 28 includes a transformer 81, a component case 82, and a potting material 83 provided therebetween.

The component case 32 has a cylindrical portion surrounding the lateral side of the transformer 31 and an upper portion having a truncated conical shape. In the same manner as the component case 32, the component case 82 also has a cylindrical portion surrounding the lateral side of the transformer 81 and an upper portion having a truncated conical shape.

These transformer units 27 and 28 are mounted on a common circuit board 29. However, the transformer unit 28 is smaller in size than the transformer unit 27.

The cooling plate 85 has a truncated conical hole 86a corresponding to the upper portion of the transformer unit 27, a truncated conical hole 86b corresponding to the upper portion of the transformer unit 28, and a flow path 87 through which the cooling water flows. However, the hole 86a corresponding to the upper portion of the transformer unit 27 is a through-hole that penetrates from the lower surface to the upper surface of the coding plate 85, whereas the hole 86b corresponding to the upper portion of the transformer unit 28 does not penetrate the upper surface of the cooling plate 85. The depth of the hole 86b is set to be equal to a difference between the height of the transformer unit 27 and the height of the transformer unit 28.

In the present embodiment, as illustrated in FIG. 16, multiple heat-generating components (the transformer 31 and the transformer 81 in this example) are cooled by one cooling plate 85.

Even in the present embodiment, in the same manner as the first embodiment, the entire transformers 31 and 81 may be cooled, and the temperature of the transformers 31 and 81 may be avoided from exceeding the allowable upper-limit temperature. Therefore, it is unnecessary to excessively limit the current flowing through the transformers 31 and 81, so that the transformers 31 and 81 are able to exert the original performance thereof.

Figure 17:
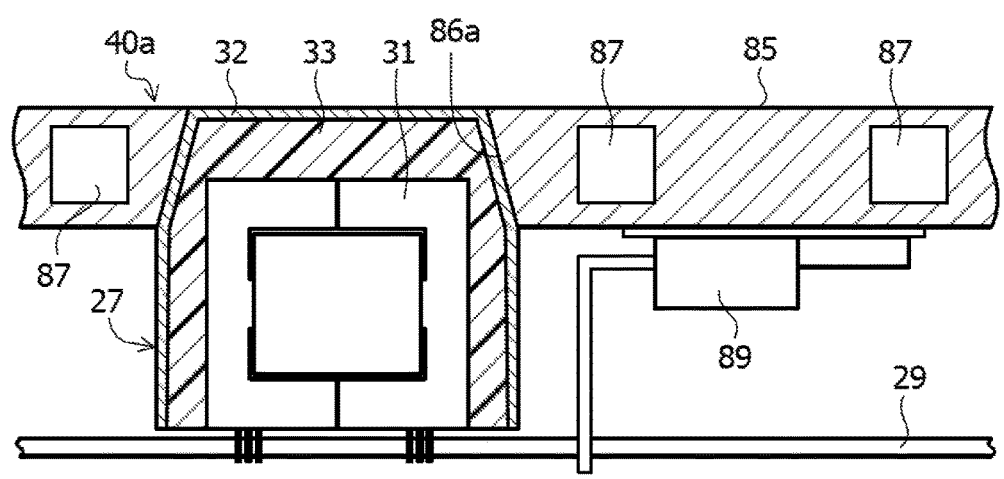
FIG. 17 is a cross-sectional view illustrating a modification of the third embodiment.

In the present embodiment, although a case where both the two heat generating components are transformers has been described, one of the heat generating components may be a semiconductor component such as, for example, a Field Effect Transistor (FET) or a diode. FIG. 17 illustrates an example in which an FET 89 is connected to the cooling plate 85 instead of the transformer unit 28.

Fourth Embodiment

Figure 18:
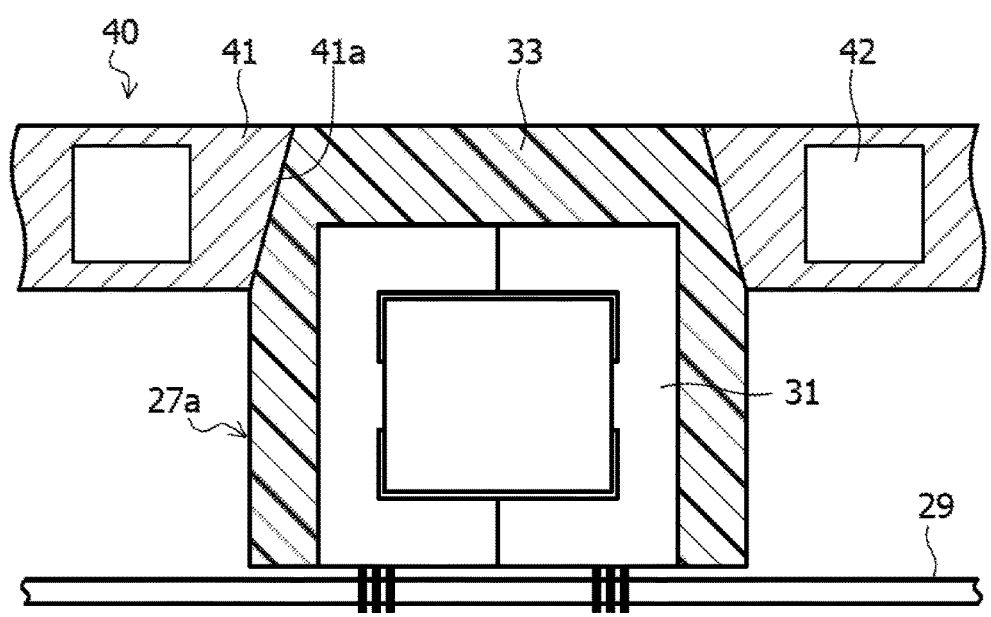
FIG. 18 is a cross-sectional view illustrating a cooling unit according to a fourth embodiment.

FIG. 18 is a cross-sectional view (schematic view) illustrating a cooling unit according to a fourth embodiment. The present embodiment is different from the first embodiment in that it includes no component case, and the other components are basically similar to those in the first embodiment. Therefore, the components similar to those in FIG. 6 are given the same reference numerals in FIG. 18, and the detailed descriptions thereof will be omitted.

When the thermal conductivity of the potting material is high, a transformer unit 27*a* may have a structure that does not include the component case as illustrated in FIG. 18. For example, as in the first embodiment, the transformer 31 may be covered with the component case 32 so that the space between the transformer 31 and the component case 32 is filled with the potting material 33, and after the potting material 33 is sufficiently cured, the component case 32 may be removed so as to obtain the transformer unit 27*a*.

Fifth Embodiment

In the first embodiment (see, e.g., FIG. 6), the transformer 31 and the potting material 33 are disposed in the component case 32 to form the transformer unit 27, and the component case 32 of the transformer unit 27 is fitted into the hole in the cooling plate 41 so as to form the cooling unit 40.

Figure 19:
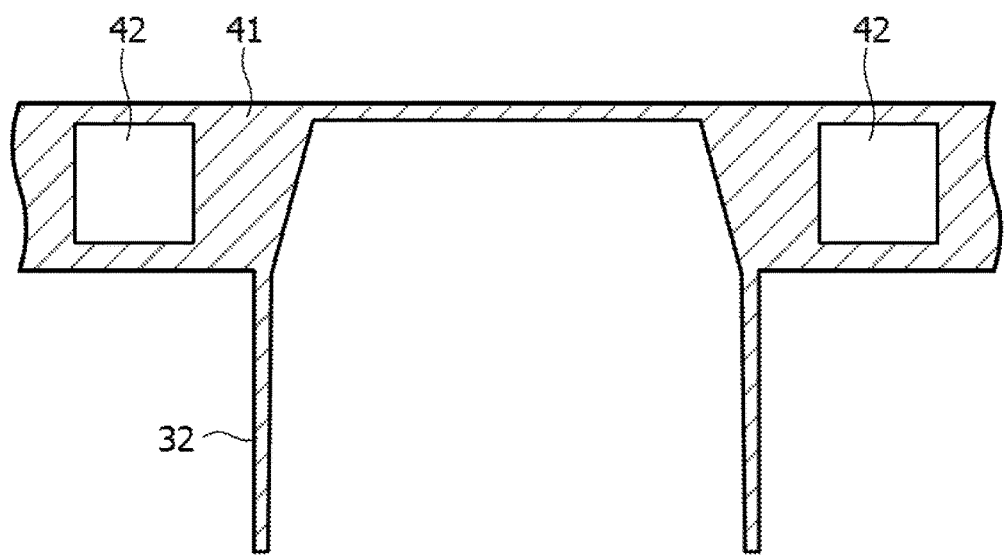
FIG. 19 is a cross-sectional view illustrating a cooling plate of a cooling unit of a fifth embodiment.

However, as illustrated in FIG. 19, the cooling plate 41 and the component case 32 may be integrated with each other, and for example, the transformer unit 27*a* illustrated in FIG. 18 may be disposed in the component case 32.

In all of the first to fifth embodiments described above, descriptions have been made with reference to a case where an electronic component to be cooled by a cooling unit is a transformer. However, the disclosed technique may also be applied to the cooling of winding components (e.g., an inductor and a motor) and other electronic components, other than the transformer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A cooling apparatus comprising:
   an assembly including an electronic device, a potting material that covers a side portion and an upper portion of the electronic device, and a component case that covers a side portion and an upper portion of the potting material, the assembly having a truncated conical upper portion; and
   a cooling plate including a truncated conical hole into which the upper portion of the assembly is fitted such that an upper portion of the component case and the cooling plate are in a surface contact with each other, and a flow path through which a coolant flows,
   the flow path of the cooling plate is disposed in a zigzag form to avoid the truncated conical hole into which the upper portion of the assembly is fitted.

2. The cooling apparatus according to claim 1, wherein the potting material is filled between the electronic device and the component case.

3. The cooling apparatus according to claim 1, wherein the component case is formed of any one of copper, a copper alloy, aluminum, and an aluminum alloy.

4. The cooling apparatus according to claim 1, wherein the upper portion of the assembly has an elliptical shape or a polygonal shape when viewed from above.

5. The cooling apparatus according to claim 1, wherein one of the assembly and the cooling plate has a convex portion, and a remaining one has a concave portion, into which the convex portion is fitted.

6. The cooling apparatus according to claim 1, wherein the electronic device is a winding component.

7. The cooling apparatus according to claim 1, wherein each of the assembly and the conical hole is formed in a plural number, and a size of each conical hole is set according to a size of a corresponding assembly.

8. The cooling apparatus according to claim 1, wherein the cooling plate is thermally coupled to a semiconductor component, separately from the electronic device.

9. An information processing apparatus comprising:
   an assembly including an electronic device, a potting material that covers a side portion and an upper portion of the electronic device, and a component case that covers a side portion and an upper portion of the potting material, the assembly having a truncated conical upper portion;
   a cooling plate having a truncated conical hole into which the upper portion of the assembly is fitted such that an upper portion of the component case and the cooling plate are in a surface contact with each other, and a flow path through which a coolant flows; and
   a board on which the assembly is mounted,
   the flow path of the cooling plate is disposed in a zigzag form to avoid the truncated conical hole into which the upper portion of the assembly is fitted.

10. The information processing apparatus according to claim 9, further comprising: a heat dissipation unit that dissipates heat transported from the cooling plate to an atmosphere via the coolant.

* * * * *